United States Patent [19]

Yamazaki

[11] Patent Number: 4,741,800
[45] Date of Patent: May 3, 1988

[54] ETCHING METHOD FOR THE MANUFACTURE OF A SEMICONDUCTOR INTEGRATED CIRCUIT

[75] Inventor: Shunpei Yamazaki, Tokyo, Japan

[73] Assignee: Semiconductor Energy Laboratory Co., Ltd., Tokyo, Japan

[21] Appl. No.: 823,398

[22] Filed: Jan. 28, 1986

[30] Foreign Application Priority Data

Jan. 28, 1985 [JP] Japan .................... 60-013901

[51] Int. Cl.[4] ............................................. C03C 5/06
[52] U.S. Cl. ............................. 156/643; 156/646; 204/298; 204/192.32; 204/192.35; 219/121 PH
[58] Field of Search ............................. 156/643, 646; 204/192 E, 298; 219/121 PH

[56] References Cited

U.S. PATENT DOCUMENTS

| | | | |
|---|---|---|---|
| 4,380,488 | 4/1983 | Reichelderfer et al. | 156/643 |
| 4,522,674 | 6/1985 | Ninomiya et al. | 156/643 X |
| 4,540,466 | 9/1985 | Nishizawa | 156/643 |
| 4,575,408 | 3/1986 | Bok | 156/643 X |

*Primary Examiner*—Robert L. Lindsay
*Attorney, Agent, or Firm*—Gerald J. Ferguson, Jr.; Michael P. Hoffman; Michael J. Foycik, Jr.

[57] ABSTRACT

A dry etching method for use in the manufacture of a semiconductor integrated circuit using an etching apparatus which is provided with an exciting chamber into which a reactive gas is introduced and an etching chamber which communicates with the reactive gas exciting chamber in which a substrate to be etched is placed, wherein the reactive gas is excited by microwave energy and then the excited reactive gas is introduced into the etching chamber where the excited reactive gas is re-excited by light energy, preferably of the wavelength of the range 180–400 nm, where the re-excited reactive gas is passed over the substrate during the etching thereof.

29 Claims, 1 Drawing Sheet

ETCHING METHOD FOR THE MANUFACTURE OF A SEMICONDUCTOR INTEGRATED CIRCUIT

BACKGROUND OF THE INVENTION

1. Field of the Invention

The present invention relates to an etching method, and more particularly to a dry etching method for use in the manufacture of a semiconductor integrated circuit.

2. Description of the Prior Art

For the manufacture of semiconductor integrated circuits, a dry etching process is now attracting attention for the reason that it permits fine etching of a substrate, as compared with a wet etching technique.

According to conventional dry etching methods, a substrate to be etched is disposed in an etching chamber, in which a reactive gas is excited through use of DC energy, high-frequency wave energy or microwave energy for etching the substrate.

With the method employing the microwave energy, the reactive gas can be formed as an excited reactive gas of no great kinetic energy. Accordingly, this method is superior to the other methods in that it is capable of etching the substrate without impairing it by sputtering.

It has also been proposed, as another dry etching process, to excite the reactive gas by light energy in the etching chamber in which the substrate to be etched is placed.

This method also possesses the advantage of etching the substrate without causing any damage thereto by sputtering, for the same reason as is the case with the method utilizing microwave energy.

However, the method utilizing microwave energy and the method utilizing light energy are both far lower in the etching rate than the etching methods using DC energy and high-frequency wave energy, and hence consume a far longer period of time for etching than do the latter methods. Futhermore, the method utilizing the microwave energy encounters difficulty in forming the excited reactive gas over a wide region, and hence is defective in that it is difficult to etch a substrate of a large area uniformly all over it at a time. In the case of the etching method utilizing light energy, some of reactive gases that can be used with the etching method employing microwave energy cannot be sufficiently excited by light energy. Therefore, this method has the shortcoming that it cannot be used with relatively easily available reactive gases.

SUMMARY OF THE INVENTION

It is therefore an object of the present invention to provide a novel etching process, in particular, dry etching process which is free from the above-mentioned defects of the prior art.

According to the present invention, an etching apparatus is used which is provided with an exciting chamber into which a reactive gas is introduced and an etching chamber which communicates with the reactive gas exciting chamber and in which a substrate to be etched is placed.

In the exciting chamber the reactive gas is excited by microwave energy which may preferably have a frequency of 1 to 10 GHz, and then the excited reactive gas is introduced into the etching chamber.

In the etching chamber the excited reactive gas is re-excited by light energy preferably of a wavelength in the range of 180 to 400 nm which can easily be obtained with a mercury lamp. Thus the substrate is etched by the re-excited reactive gas. In this instance, it is preferable, for improving the etching rate, that the re-excited reactive gas be passed over the substrate during the etching thereof. It is also preferable that the substrate be disposed with its surface held in parallel to the stream of the re-excited reactive gas, that the stream of the re-excited reactive gas be 5 mm or less in thickness and that the light be entered into the etching chamber in a direction substantially perpendicular to the substrate surface. In this case, by using an optical mask, the substrate can be etched into a pattern corresponding to that of the optical mask. Moreover, it is also preferable that argon, neon, krypton or like assistant gas which, when excited, retains its excited state for a longer period of time than does the reactive gas be excited in the exciting chamber, along with the reactive gas, thereby preventing the reduction of the activity of the excited reactive gas.

According to the etching process of the present invention, the reactive gas once excited by microwave energy is further excited by light energy, and the substrate is etched by the thus twice excited reactive gas. As a result of this, the substrate can be etched at a far higher rate than in the case of using the reactive gas excited by microwave energy or light energy only once. The substrate is not impaired by sputtering although etched at such a high etching rate. Besides, even if the excited reactive gas cannot be formed over a wide region in the exciting chamber, the excited gas can be spread over the entire area of the substrate in the etching chamber and light energy can be imparted uniformly to the excited reactive gas spreading in the etching chamber, so that a substrate of a wide area can also be etched with ease.

In addition, even if the reactive gas which cannot sufficiently be excited by light energy alone is employed, the substrate can be etched at a high etching rate.

Other object, features and advantages of the present invention will become more fully apparent from the following detailed description taken in conjunction with the accompanying drawings.

DESCRIPTION OF THE PREFERRED EMBODIMENTS

Figure 1:
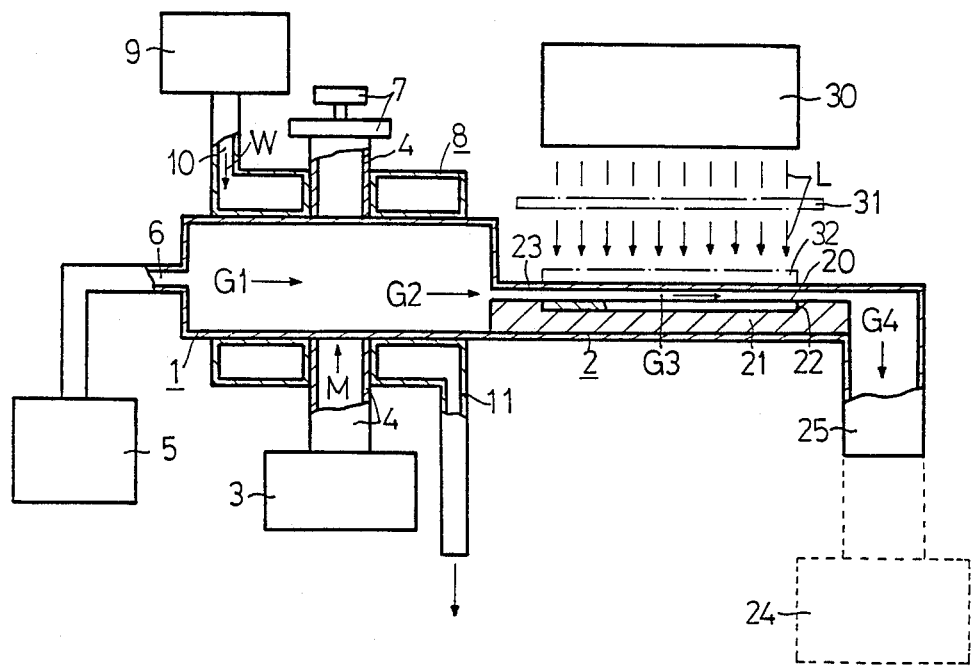
FIG. 1 is a schematic diagram illustrating the etching method of the present invention, along with an example of an apparatus for use therein.

FIG. 1 illustrates an example of the etching method of the present invention, together with an example of an apparatus which is used therefor.

The apparatus is provided with an exciting chamber 1 and an etching chamber 2.

The exciting chamber 1 extends across a microwave guide tube 4 connected with a microwave source 3 such as a magnetron and has at its one end an inlet 6 connected to a reactive gas source 5.

The exciting chamber 1 is made of, for example, quartz, i.e. a material which permits the passage therethrough of microwaves from the microwave source 3 and does not react with a reactive gas from the reactive gas source 5. The mirowave guide tube 4 terminates with a matching adjustor 7.

A reactive gas G1 is introduced into the exciting chamber 1 from the reactive gas source 5, as indicated by the arrow, and microwave M is applied from the microwave source 3, as indicated by the arrow. The reactive gas G1 is excited by the microwave M, forming an excited reactive gas G2. In this instance, the matching adjustor 7, with which the microwave guide tube 4, serves to effectively excite the reactive gas G1 by the microwave M.

Disposed around the exciting chamber 1 is a cooling chamber 8 which has an inlet 10 connected to a source 9 of a cooling medium such as water and a drain pipe 11 extending to the outside. The cooling medium W from the cooling medium source 9 is introduced into the cooling chamber 8, as indicated by the arrow, whrerein it circulates. In consequence, the etching chamber 1 and the excited reactive gas G2 are cooled by the cooling medium W through the cooling chamber 8 so that particles of the excited reactive gas G2 would not unnecessarily adhereto the inner wall of the exciting chamber 1.

The etch chamber 2 is made of the same material as that of the exciting chamber 1, that is, quartz, and is flat in shape. The etching chamber 2 is connected at one end to the exciting chamber 1 on the opposite side from the reactive gas inlet 6. Further, the etching chamber 2 has at the other end an exhaust pipe 25 which extends outwardly thereof on the side opposite from the exciting chamber 1 and is open to the air, or connected to a suitable exhausing means 24, as indicated by the broken line.

A substrate 20 to be etched is held in the etching chamber 2 through use of a holder 21. The holder 21 is made of the same material as that of the etching chamber 2 and flat in shape and has a recess 22 made in the top surface thereof for supporting the substrate 20 with its top surface held substantially flush with the top surface of the holder 21. The excited reactive gas G2 is introduced into the etching chamber 2 from the exciting chamber 1, as indicated by the arrow.

The excited reactive gas G2 will flow between the top surface of the substate 20 and the interior surface of the top wall 23 of the etching chamber 2 toward an exhaust pipe 25 at a relatively low speed. The thickness of the holder 21 is selected such that the excited reactive gas G2 may flow with a thickness as small as 10 $\mu$m to 5 mm, for example, 50 $\mu$m in the space defined between the surface of the substrate 20 and the interior surface of the top wall 23 of the etching chamber 2.

A light source 30 is disposed above the etching chamber 2 and a suitable shutter means 31 is disposed between the light source 30 and the etching chamber 2. Between the shutter means 31 and the etching chamber 2 an optical mask 32 is positioned in contact with the top wall 23 of the etching chamber 2, as required.

Light L from the light source 30 into the etching chamber 2 through the shutter 31 (opened) and, if necessary, through the optical mask 32, so that the light L may irradiate all over the top surface of the substrate 20, as indicated by the arrow. By the incidence of the light L the excited reactive gas G2 between the top surface of the substrate 20 and the top wall 23 of the etching chamber 2 is re-excited, forming a re-excited reactive gas G3 which slowly passes over the substrate 20. Since the excited reactive gas G2 is re-excited by the light L while it is slowly flowing with a small thickness between the top surface of the substrate 20 and the top wall 23 of the etching chamber 2, the excited reactive gas G2 is effectively excited, and consequently the re-excited reactive gas G3 is effectively obtained. The re-excited reactive gas G3 slowly passes over the substrate 20 in the thin space between it and the top wall 23 of the etching chamber 2 toward the exhaust pipe 25. The substrate 1 is effectively etched by the stream of the re-excited reactive gas G3. By entering the light L into the etching chamber 2 through the optical mask 32, the substrate 1 is etched into a pattern corresponding to that of the optical mask 32.

The re-excited reactive gas G3 use for etching the substrate 1 is directly exhausted as an exhaust gas G4 to the open air via the exhaust pipe 12, or recovered via the exhaust means 25.

EXAMPLE 1

A silicon substrate was disposed, as the substrate 20 to be etched, in the etching chamber 2, and chlorine gas was used as the reactive gas G1 available from the reactive gas source 5. The chlorine gas was introduced into the exciting chamber 1 at a flow rate of 200 cc/min. As the microwave M from the microwave source 3, microwave of a frequency 2.45 GHz and a power 100 to 400 W as used, by which the chlorine gas was excited, obtaining excited chlorine gas as the excited reactive gas G2.

The excited chlorine gas was introduced into the etching chamber 2. As the light L form the light source 30, near ultraviolet rays of a wavelenght ranging from 180 to 400 nm, which are obtained with a mercury lamp, are entered into the etching chamber 2 without using the optical mask 32 so that an intensity of 40 mW/Cm$^2$ might be obtained on the surface of the substrate 20. The excited chlorine gas was re-excited by the near ultraviolet radiation to obtain the re-excited reactive gas G3, by which the silicon substrate was etched. In this case, the inside of the etching chamber 2 was held at the atmospheric pressure (760 Torr).

Figure 2:
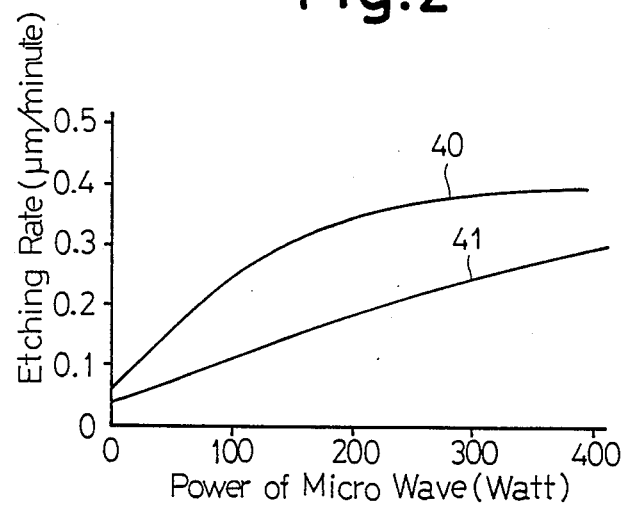
FIG. 2 is a graph showing the relation of the substrate etching rate to the power of microwave for exciting a reactive gas.

In this example, the silicon substrate could be etched at a high etching rate in the range from about 0.22 $\mu$m/min (in the case of the power of microwave being 100 W) to about 0.4 $\mu$m/min (in the case of the power of microwave being 400 W), as indicated by the curve 40 which showing the relation of the substrate etching rate ($\mu$m/min) to the power (Watt) of microwave in FIG. 2.

Incidentally, in the case where the chlorine gas, as the reactive gas G1, was not excited in the exciting chamber 1 (the power of microwave being 0 W) and the unexcited chlorine gas was directly introduced into the etching chamber 2, wherein it was excited by the light L and the silicon substrate was etching by the excited chlorine gas, the etching rate was only about 0.06 $\mu$m/min.

EXAMPLE 2

A substrate which has a 1.3 $\mu$m thick aluminum film formed on a silicon substrate with a 0.5 $\mu$m thick silicon oxide film sandwiched therebetween, was placed, as the substrate 20, in the etching chamber 2. A gas mixture of fluorine chloride (FCl$_4$) gas and hydrogen gas (H$_2$) was used as the reactive gas G1 from the reactive gas source 5. The gas mixture was introduced into the exciting chamber 1 at the same rate as in Example 1, wherein it was excited by the same microwave as used in Example 1. The excited gas mixture was then introduced into the etching chamber 2.

The excited gas mixture was re-excited by the same light L as used in Example 1, and the re-excited gas mixture was used for etching the aluminum film of the substrate. The pressure in the etching chamber was held equal to the atmospheric pressure as in Example 1.

In this example, the aluminum film could be etched at an etching rate in the range of about 0.1 μm/min (in the case of the power of microwave being 100 W) to about 0.3 μm/min (in the case of the power of microwave being 400 W), as indicated by the curve 41 in FIG. 2.

Incidentally, in the case where the gas mixture, as the reactive gas G1, was not excited in the exciting chamber but it was excited by the light L and the aluminum film of the substrate was etched by the excited gas mixture, the etching rate was only about 0.04 μm/min.

When a substrate with a silicon oxide, silicon nitride or aluminum nitride film was etched using, as the reactive gas G1, $NF_3$ gas or gas mixture of $NF_3$ and $Cl_2$ gases and in the same manner as discribed above in respect to Examples 1 and 2, the film could be etched at a high etching rate, though not described in detail.

When a substrate with a titanium or titanium silicide film was etched using, as the reactive gas G1, $Cl_2$ gas and in the same manner as in the above examples, the film could be etched at high etching rate. Futhermore, when a substrate with a known photoresist film was etched using a gas mixture of oxygen gas and argon and in the same manner as in the above examples, the film could be etched at a high rate.

Moreover, in the case where excimer laser light was used, as the light L, for re-exciting each of the aforementioned various excited reactive gases and the aforesaid substrate or each of the substrates with the above-said films was etched by the re-excited reactive gase, the substrate or the film could be etched at a high etching rate.

In addition by exciting argon, neon or keypton simultaneously with the excitation of the reactive gas G1, a high etching rate could similarly be achieved.

The foregoing description should be construed as being merely illustrative of the present invention and should not be construed as limiting the invention specifically thereto. For example, it is also possible to effect the etching while heating the substrate, or holding the inside of the etching chamber 2 under a diminished pressure.

It will be apparent that many modifications and variations may be effected without departing from the scope of the novel concepts of the present invention.

What is claimed is:

1. An etching method for use in the manufacture of a semiconductor integrated circuit, which employs an etching apparatus provided with an exciting chamber into which a reactive gas is introduced and an etching chamber which communicates with the exciting chamber and in which a substrate to be etched is disposed, the etching method comprising the steps of:
    exciting the reactive gas by microwave energy in the exciting chamber;
    introducing the excited reactive gas from the exciting chamber into the etching chamber in the form of a thin layer parallel and contiguous to the surface of said substrate; and
    irradiating, with light, the excited reactive gas and the substrate surface therethrough such that the excited reactive gas is re-excited by the light, thereby etching the substrate surface.

2. An etching method according to claim 1, wherein the etching of a substrate is performed by passing a stream of the re-excited reactive gas over the substrate surface.

3. An etching method according to claim 1, wherein the etching of a substrate is performed with the substrate surface held in parallel to the stream of the re-excited reactive gas.

4. An etching method according to claim 3 wherein the etching of the substrate is performed with the stream of the re-excited reactive gas held to a thickness of 5 mm or less.

5. An etching method according to claim 3 wherein the etching of the substrate is performed entering the light into the etching chamber in a direction substantially perpendicular to the substrate surface.

6. An etching method according to claim 5 wherein the etching of the substrate is performed entering the light into the etching chamber through an optical mask, thereby etching the substrate into a pattern corresponding to that of the optical mask.

7. An etching method according to claim 2 wherein the etching of the substrate is performed maintaining the gas pressure in the etching chamber substantially equal or close to the atmospheric pressure.

8. An etching method according to claim 1 wherein a microwave having a frequency in the range of 1 to 10 Ghz is used as a source of the microwave energy for exciting the reactive gas.

9. An etching method according to claim 1 wherein light having a wavelength in the range of 180 to 400 nm is used as a source of the light energy for re-exciting the reactive gas.

10. An etching method according to claim 1 wherein a microwave having a wavelength in the range of 1 to 10 Ghz is used as a source of the microwave energy for exciting the reactive gas, and wherein light having a wavelength of 180 to 400 nm is used as a source of light energy for re-exciting the excited reactive gas.

11. An etching method according to claim 9 or 10 wherein light from a mercury lamp is used as the light.

12. An etching method according to claim 1 wherein the exciting of the reactive gas is performed exciting an assistant gas such as argon, neon, crypton or the like in the exciting chamber, along with the reactive gas.

13. An etching method according to claim 1 wherein said substrate is irradiated through an optical mask.

14. An etching method according to claim 1 wherein said substrate is irradiated through its principal surface with the light.

15. An etching method according to claim 1 wherein the surface of said substrate is of silicon.

16. An etching method according to claim 1 wherein the surface of said substrate is of aluminum.

17. An etching method according to claim 1 wherein the surface of said substrate is of silicide.

18. An etching method according to calim 17 wherein the surface of said substrate is of silicon oxide.

19. An etching method according to claim 17 wherein the surface of said substrate is of silicon nitride.

20. An etching method according to claim 1 wherein the surface of said substrate is of aluminum nitride.

21. An etching method according to claim 1 wherein the surface of said substrate is of organic film.

22. An etching method according to claim 1 wherein the surface of said substrate is of metal.

23. An etching method according to claim 22 wherein the surface of said substrate is of titanium.

24. An etching method according to claim 1 wherein the surface of said substrate is of titanium silicide.

25. An etching method according to claim 17 wherein said reactive gas is fluoride.

26. An etching method according to claim 22 wherein said reactive gas is chloride.

27. An etching method according to claim 1 wherein said substrate is irradiated with eximer laser light.

28. An etching method according to claim 27 wherein the eximer laser is a KrCl laser.

29. An etching method according to claim 28 wherein the wavelength of laser light is 222 nm.

* * * * *